(12) United States Patent
Davis et al.

(10) Patent No.: US 10,745,272 B2
(45) Date of Patent: *Aug. 18, 2020

(54) MICROSCALE METALLIC CNT TEMPLATED DEVICES AND RELATED METHODS

(71) Applicant: Brigham Young University, Provo, UT (US)

(72) Inventors: Robert C. Davis, Provo, UT (US); Richard R. Vanfleet, Provo, UT (US)

(73) Assignee: Brigham Young University, Provo, UT (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/723,004

(22) Filed: Oct. 2, 2017

(65) Prior Publication Data

US 2018/0079642 A1    Mar. 22, 2018

Related U.S. Application Data

(63) Continuation of application No. 13/657,678, filed on Oct. 22, 2012, now Pat. No. 9,776,859.

(Continued)

(51) Int. Cl.
| | |
|---|---|
| *B81C 1/00* | (2006.01) |
| *B81B 3/00* | (2006.01) |
| *B82Y 15/00* | (2011.01) |
| *B82Y 30/00* | (2011.01) |
| *B82Y 40/00* | (2011.01) |

(52) U.S. Cl.
CPC ........ *B81C 1/00666* (2013.01); *B81B 3/0072* (2013.01); *B81C 1/00619* (2013.01); *B81B 2201/025* (2013.01); *B82Y 15/00* (2013.01); *B82Y 30/00* (2013.01); *B82Y 40/00* (2013.01)

(58) Field of Classification Search
CPC .................... B81B 2201/025; B81C 1/00619
See application file for complete search history.

(56) References Cited

U.S. PATENT DOCUMENTS

| | | | | |
|---|---|---|---|---|
| 9,776,859 | B2 * | 10/2017 | Davis | ................ B81C 1/00666 |
| 2007/0243124 | A1 * | 10/2007 | Baughman | ............ B82Y 30/00 |
| | | | | 423/447.1 |

(Continued)

*Primary Examiner* — Stephen M Bradley
(74) *Attorney, Agent, or Firm* — Miller IP Law, LLC

(57) ABSTRACT

A microscale device may include a patterned forest of vertically grown and aligned carbon nanotubes defining a carbon nanotube forest with the nanotubes having a height defining a thickness of the forest. The patterned forest may define a patterned frame that defines one or more components of the microscale device. The microscale device may also include a conformal coating of substantially uniform thickness extending throughout the carbon nanotube forest. The carbon nanotube forest may have a thickness of at least three microns. The conformal coating may substantially coat the nanotubes, define coated nanotubes and connect adjacent nanotubes together such that the carbon nanotube forest is sufficiently robust for liquid processing, without substantially filling interstices between individual coated nanotubes. The microscale device may also include a metallic interstitial material infiltrating the carbon nanotube forest and at least partially filling interstices between individual coated nanotubes.

19 Claims, 5 Drawing Sheets

Related U.S. Application Data

(60) Provisional application No. 61/627,919, filed on Oct. 20, 2011.

(56) References Cited

U.S. PATENT DOCUMENTS

| | | | | |
|---|---|---|---|---|
| 2008/0296537 A1* | 12/2008 | Gordon | ................ | B82Y 10/00 |
| | | | | 252/506 |
| 2009/0085426 A1* | 4/2009 | Davis | ........................ | H01J 5/18 |
| | | | | 310/306 |
| 2010/0119708 A1* | 5/2010 | Overzet | ................ | B82Y 30/00 |
| | | | | 427/212 |
| 2010/0176489 A1* | 7/2010 | Ayazi | .................... | B81B 3/0086 |
| | | | | 257/595 |
| 2012/0031644 A1* | 2/2012 | Maxwell | ................ | H01B 1/04 |
| | | | | 174/126.1 |
| 2012/0227487 A1* | 9/2012 | Ayazi | ................ | G01C 19/5698 |
| | | | | 73/504.08 |

* cited by examiner

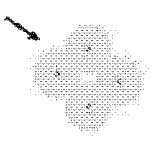 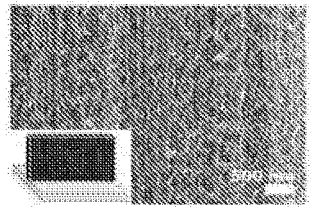
FIG. 3A    FIG. 3B
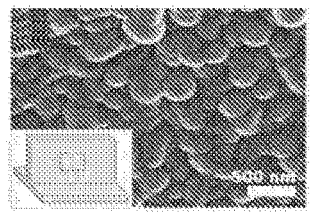 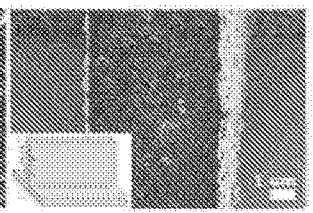
FIG. 3C    FIG. 3D
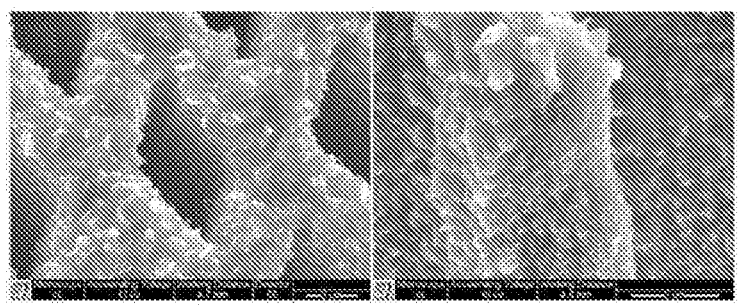
FIG. 4A    FIG. 4B

MICROSCALE METALLIC CNT TEMPLATED DEVICES AND RELATED METHODS

PRIORITY CLAIMS

This application is a continuation of U.S. patent application Ser. No. 13/657,678 ("the '678 Application"), filed Oct. 22, 2012. The '678 application claims priority to U.S. Provisional Patent Application No. 61/627,919, filed Oct. 20, 2011. The aforementioned applications are incorporated herein by reference as if fully set forth.

BACKGROUND

Field of the Invention

The present invention relates generally to three-dimensional microscale structures and methods relating to the formation of such structures.

Related Art

Precision manufacturing of three-dimensional structures on the microscale is of great interest in a variety of sensing and related applications. At present, however, such endeavors have been limited to relatively low aspect ratio devices and to a narrow range of materials. Metals and metal alloys are commonly used in larger applications, but have faced significant barriers at the microscale level.

SUMMARY OF THE INVENTION

It has been recognized that it would be advantageous to develop high aspect ratio, three-dimensional microscale structures from metals to metal alloys.

In accordance with an aspect of the present disclosure, a microscale device is disclosed. The microscale device may include a patterned forest of vertically grown and aligned carbon nanotubes defining a carbon nanotube forest with the nanotubes having a height defining a thickness of the forest. The patterned forest may define a patterned frame that defines one or more components of the microscale device. The microscale device may also include a conformal coating of substantially uniform thickness extending throughout the carbon nanotube forest. The carbon nanotube forest may have a thickness of at least three microns. The conformal coating may substantially coat the nanotubes, define coated nanotubes and connect adjacent nanotubes together such that the carbon nanotube forest is sufficiently robust for liquid processing, without substantially filling interstices between individual coated nanotubes. The microscale device may also include a metallic interstitial material infiltrating the carbon nanotube forest and at least partially filling interstices between individual coated nanotubes.

At least one component of the patterned frame may be fixed and at least one component of the patterned frame may be moveable relative to the fixed component. The metallic interstitial material may be applied by an electroplating process. The metallic interstitial material may infiltrate the carbon nanotube forest with an infiltration uniformity achieved by application of the electroplating process to the carbon nanotube forest.

The conformal coating may include a carbon material. The metallic interstitial material may include nickel.

The thickness of the carbon nanotube forest may be between 3 µm (microns) and 9 mm. The microscale device may include a microelectromechanical systems (MEMS) device.

The microscale device may define at least a portion of a sensor. The sensor may include a gyro. The gyro may include a transductive capacitor that includes a capacitive gap in the form of a trench defined by the microscale device. The trench may include a height-to-width ratio of at least 100:1.

In accordance with another aspect of the present disclosure, a microscale device is disclosed. The microscale device may include a patterned forest of vertically grown and aligned carbon nanotubes defining a carbon nanotube forest with the nanotubes having a height defining a thickness of the forest. The patterned forest may define a patterned frame that defines one or more components of the microscale device. The carbon nanotube forest may include at least one feature including a height-to-width ratio greater than 100:1. The microscale device may also include a conformal coating of substantially uniform thickness extending throughout the carbon nanotube forest. The carbon nanotube forest may have a thickness of at least three microns. The conformal coating may substantially coat the nanotubes, define coated nanotubes and connect adjacent nanotubes together, without substantially filling interstices between individual coated nanotubes. The microscale device may also include a metallic interstitial material infiltrating the carbon nanotube forest and at least partially filling interstices between individual coated nanotubes.

At least one component of the patterned frame may be fixed and at least one component of the patterned frame may be moveable relative to the fixed component. The microscale device may define at least a portion of a gyro that includes a transductive capacitor. The feature may include a capacitive gap in the form of a trench defined by the microscale device.

The feature may include a height-to-width ratio greater than 200:1. The metallic interstitial material may be applied by an electroplating process. The metallic interstitial material may infiltrate the carbon nanotube forest with an infiltration uniformity achieved by application of the electroplating process to the carbon nanotube forest.

The conformal coating may include a carbon material. The metallic interstitial material may include nickel.

In accordance with another aspect of the present disclosure, a microscale device is disclosed. The microscale device may include a patterned forest of vertically grown and aligned carbon nanotubes defining a carbon nanotube forest with the nanotubes having a height defining a thickness of the forest. The patterned forest may define a patterned frame that defines one or more components of the microscale device. The microscale device may also include a conformal coating of substantially uniform thickness extending throughout the carbon nanotube forest. The carbon nanotube forest may have a thickness of at least three microns. The conformal coating may substantially coat the nanotubes, define coated nanotubes and connect adjacent nanotubes together, without substantially filling interstices between individual coated nanotubes. The microscale device may also include a metallic interstitial material infiltrating the carbon nanotube forest and at least partially filling interstices between individual coated nanotubes. The metallic interstitial material may infiltrate the carbon nanotube forest with an infiltration uniformity achieved by application of an electroplating process to the carbon nanotube forest.

The infiltration uniformity may be achieved by application of a pulsed current. The carbon nanotube forest may include at least one feature including a height-to-width ratio greater than 100:1.

At least one component of the patterned frame may be fixed and at least one component of the patterned frame may be moveable relative to the fixed component. The microscale device may define at least a portion of a gyro that includes a transductive capacitor. The feature may include a capacitive gap in the form of a trench defined by the microscale device.

The conformal coating may include a carbon material. The metallic interstitial material may include nickel.

BRIEF DESCRIPTION OF THE DRAWINGS

Additional features and advantages of the invention will be apparent from the detailed description which follows, taken in conjunction with the accompanying drawings, which together illustrate, by way of example, features of the invention; and, wherein:

FIGS. 3A through 3D illustrate various steps in a process of filling a patterned CNT forest in accordance with an embodiment of the invention;

FIG. 4A is an SEM image of an electrodeposition into a CNT-M forest template;

FIG. 4B is an SEM image of a broken feature showing internal filling of the structure in accordance with an embodiment of the invention;

Figure 1A:
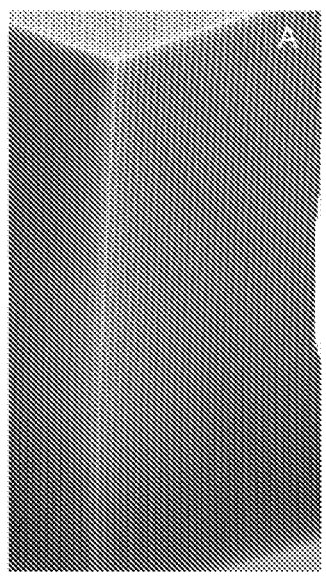
FIG. 1A is an SEM image of an exemplary block of material created using the present technology.

Reference will now be made to the exemplary embodiments illustrated, and specific language will be used herein to describe the same. It will nevertheless be understood that no limitation of the scope of the invention is thereby intended.

DETAILED DESCRIPTION OF EXAMPLE EMBODIMENT(S)

Definitions

In describing and claiming the present invention, the following terminology will be used.

As used here, the term "vertically grown" is used to describe nanotubes that are generally grown upward from a substrate or catalyst material. While such nanotubes exhibit a generally vertical attitude, it is to be understood that such tubes are not necessarily perfectly straight or perfectly upright, but will tend to grow, twist or otherwise meander laterally to some degree, as would be appreciated by one of ordinary skill in the art.

As used herein, the term "aligned" is used to describe nanotubes that generally extend in a common direction from one side or surface to another. While such nanotubes exhibit a generally or substantial alignment, it is to be understood that such tubes are not necessarily perfectly straight or perfectly aligned, but will tend to extend, twist or otherwise meander laterally to some degree, as would be appreciated by one of ordinary skill in the art. In describing and claiming the present invention, the following terminology will be used.

As used herein, the term "patterned frame" is to be understood to refer to a framework or latticework or grate that includes an often planar base and an often planar face with constituent materials of the patterned frame arranged laterally relative to, and generally beginning or terminating at, the base and the face of the patterned frame. In most cases, the patterned frame will include one or more laterally extending walls that define, circumscribe or surround one or more passages extending through the frame from the base of the frame to the face of the frame.

One non-limiting example of a patterned frame in accordance with one aspect of the present invention is a grate structure having a repeating pattern of a plurality of intersecting walls that define a plurality of equally shaped and spaced passages. These passages are typically on the macro scale compared to the spacing between, and size of, the carbon nanotubes used in the present structures.

As used herein, the term "passage" refers to an opening or a void formed in a patterned frame by the carbon nanotubes that define or constitute the frame. A passage can be completely devoid of material, or it can be filled, or partially filled, with an interstitial or conformal material. Oftentimes, the internal walls of the passages are at least covered or coated by the conformal or interstitial material.

As used herein, the term "microscale device" is used to describe devices that include features sized in the range of a few microns up to hundreds of microns. While an overall device may be very large (millimeters and larger), microscale devices may be used as one or more components that collectively make up the overall device.

As used herein, relative terms, such as "upper," "lower," "upwardly," "downwardly," "vertically," etc., are used to refer to various components, and orientations of components, of the systems discussed herein, and related structures with which the present systems can be utilized, as those terms would be readily understood by one of ordinary skill in the relevant art. It is to be understood that such terms are not intended to limit the present invention but are used to aid in describing the components of the present systems, and related structures generally, in the most straightforward manner. For example, one skilled in the relevant art would readily appreciate that a "vertically grown" carbon nanotube turned on its side would still constitute a vertically grown nanotube, despite its lateral orientation.

As used herein, the term "interstitial" material is used to refer to a material that at least partially fills interstices, or small spaces, between or in individual nanotubes that form an array or forest of nanotubes.

As used herein, the term "interlocked" is to be understood to refer to a relationship between two or more carbon nanotubes in which the nanotubes are held together, to at least some degree, by forces other than those applied by an interstitial coating or filling material. Interlocked nanotubes may be intertwined with one another (e.g., wrapped about one another), or they may be held together by surface friction forces, van der Waals forces, and the like.

When nanotubes are discussed herein as being "linearly arranged" or "extending linearly," it is to be understood that the nanotubes, while possibly being slightly twisted, curved, or otherwise meandering laterally, are generally arranged or grown so as to extend lengthwise. Such an arrangement is to be distinguished from nanotubes that are randomly dispersed throughout a medium.

As used herein, the term "substantially" refers to the complete or nearly complete extent or degree of an action, characteristic, property, state, structure, item, or result. As an arbitrary example, when an object or group of objects is/are referred to as being "substantially" symmetrical, it is to be understood that the object or objects are either completely symmetrical or are nearly completely symmetrical. The exact allowable degree of deviation from absolute completeness may in some cases depend on the specific context. However, generally speaking the nearness of completion will be so as to have the same overall result as if absolute and total completion were obtained.

The use of "substantially" is equally applicable when used in a negative connotation to refer to the complete or near complete lack of an action, characteristic, property, state, structure, item, or result. As an arbitrary example, an opening that is "substantially free of" material would either completely lack material, or so nearly completely lack material that the effect would be the same as if it completely lacked material. In other words, an opening that is "substantially free of" material may still actually contain some such material as long as there is no measurable effect as a result thereof.

Description

Precision manufacturing of three-dimensional structures on the microscale is central to a variety of sensing and other applications. At present, however, such manufacturing is limited to relatively low aspect ratios and to a narrow range of materials. Metals and metal alloys are commonly used at other length scales but have faced significant barriers at the microscale.

The present invention can be applied to a variety of microscale devices and microelectromechanical systems (MEMS). While the technology can be applied to myriad applications, some specific examples of various devices are described herein. For example, inertial sensing is one particular application that could significantly benefit from the fabrication of metal and metal alloys precisely structured into three-dimensional shapes. The present invention provides a transformative process for fabrication of high aspect ratio, three-dimensional microscale structures from metals and metal alloys. These structures are sometimes referred to herein as metal carbon nanotube templated microfabrication (metal CNT-M) structures.

MEMS-based inertial sensing of acceleration and rotation is widely used in automotive, industrial, defense, aerospace, medical, and mobile devices. Despite this widespread success, however, current MEMS inertial sensors are limited to fabrication in a narrow range of materials and at relatively low aspect ratios. Sensor fabrication to date has primarily been accomplished by bulk and surface silicon micromachining with commercial sensors primarily fabricated using surface techniques.

In inertial sensing, capacitive transduction is the chief detection mechanism. Aspect ratio (the ratio of height to gap width) is the main parameter determining the sensitivity of capacitive transduction; increasing aspect ratio increases transduction sensitivity. High aspect ratios also provide high out-of-plane mechanical stiffness which isolates sensing of motions in one direction from parasitic motions in other directions, and is desirable in many of the compliant mechanisms used in MEMS sensing and actuation. Deep reactive ion etching can produce aspect ratios up to 50:1 in micromanufactured silicon structures: however, there is no corresponding metals etching technology capable of producing high aspect ratios.

A major inertial sensing challenge is precision measurement of rotation for navigation. This is a demanding application which requires high sensitivity and low drift. Angular bias drift requirements for navigation can be as stringent as 0.001 degrees per hour. Current MEMS gyros fall far short of this requirement. MEMS gyros operate by resonating a proof mass and capacitively detecting the effects of rotation induced coriolis forces on the resonator. On the hardware side, gyro sensitivity and stability are determined by two main factors: the characteristics of the mechanical resonance and the geometry of the capacitive sensing surfaces. Higher aspect ratios in the capacitance sensing gap directly yields higher capacitance sensitivity and improved drift performance. Drift performance is also improved by increasing the resonator decay time constant. Current silicon MEMS gyro fabrication techniques yield aspect ratios around 20:1 and bias drift and yield bias stabilities around 1 degree per hour, about 1000 times too low for the most demanding navigation applications.

Many three-dimensional MEMS structures to date have been produced by deep silicon reactive ion etching (DRIE). However, the difficulty in producing extremely high aspect ratio structures (or even moderate aspect ratios in metals) by deep etching has led to the use of alternate fabrication process, such as that known as LIGA. In this process, a negative of the pattern is made and the material (usually an electroforming or moldable material) is filled into the gaps. LIGA in its original form, however, requires the use of a synchrotron radiation source. To be cost effective, a mold needs to be formed and used many times. LIGA-like processes using SU-8 have been demonstrated using more conventional lithography. These LIGA-like processes achieve smaller aspect ratios and shorter structures than true LIGA. Additionally, LIGA and LIGA-like processes for fabrication of structures with high aspect ratios rely on electrodeposition of metal layers that are very thick resulting in very high stresses. These stresses result in significant distortions even for relatively thin electrodeposited layers.

The present invention can produce feature dimensions similar to those achieved by LIGA processes: feature widths and gaps of several microns and heights of hundreds to thousands of microns resulting in extremely high aspect ratios. The present technology, however, provides some significant advantages over LIGA particularly in the thinness of the electroplating and in cost. The present electroplating process can utilize a carbon nanotube scaffolding as the electrode, such that the plating proceeds from each nanotube and only needs to proceed until it contacts the coating from the neighboring nanotube. Thus, the required electroplating thicknesses are small even for very tall features, resulting in distortion-free high aspect ratio features.

Typically, film stress (and corresponding distortion) increases with increased plating thickness: thus, the present thin plating utilized in the present technology provides a significant advantage. In addition, the costs associated with the present technology are much lower than conventional methods. The present technology can utilize inexpensive and readily available lithography, CVD, and electroplating processes.

Figure 1B:
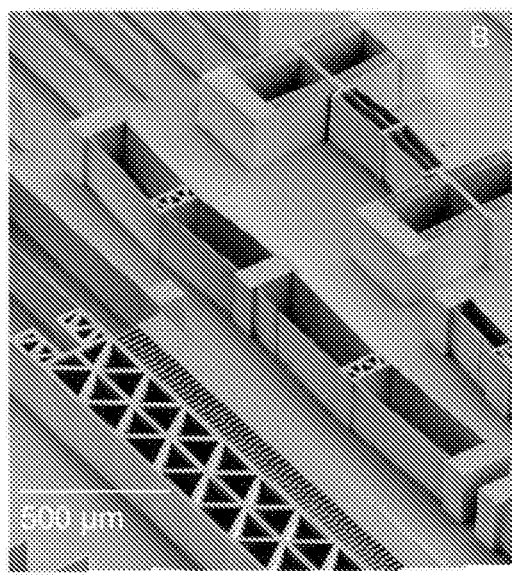
FIG. 1B is an SEM image of various silicon nitride structures for use as or in MEMS devices, the silicon nitride structures fabricated using a nitride carbon nanotube templated microfabrication (CNT-M) process in accordance with an embodiment of the invention.
Figure 1C:
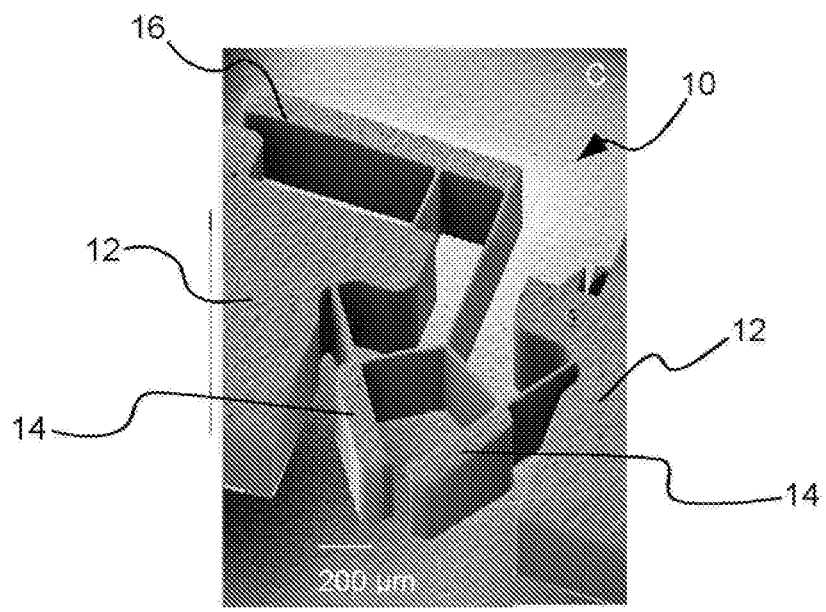
FIG. 1C is an SEM image of a freestanding MEMS device in accordance with an embodiment of the invention.
Figure 2A:
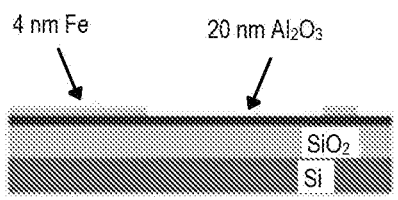
FIGS. 2A through 2E illustrate various steps in a process of creating an MEMS device in accordance with an embodiment of the invention.
Figure 2B:
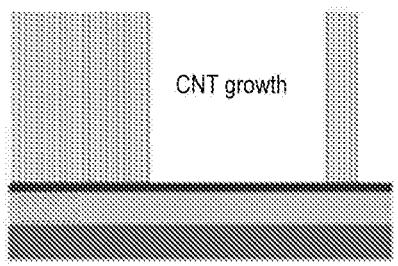
Figure 2C:
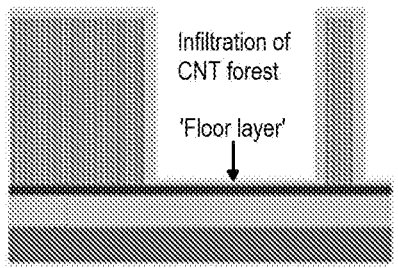
Figure 2D:
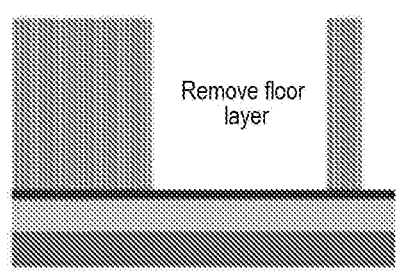
Figure 2E:
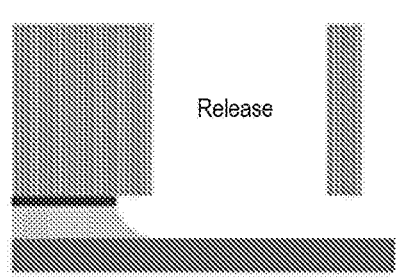
Figure 5A:
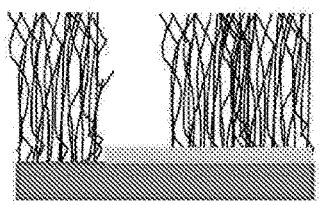
FIGS. 5A through 5H illustrate various steps of utilizing a sacrificial layer to define a sense gap in an exemplary MEMS structure in accordance with an embodiment of the invention.
Figure 5B:
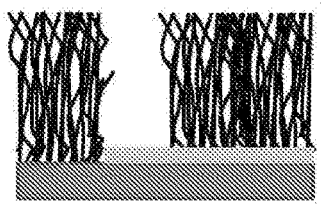
Figure 5C:
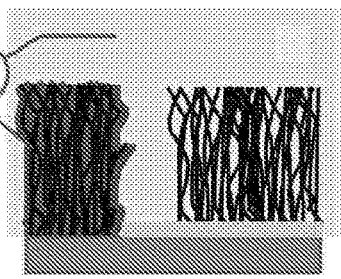
Figure 5D:
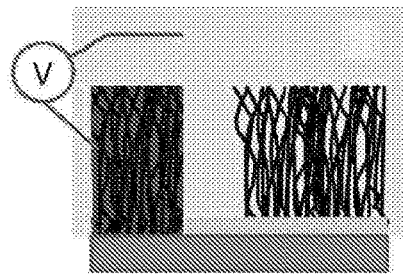
Figure 5E:
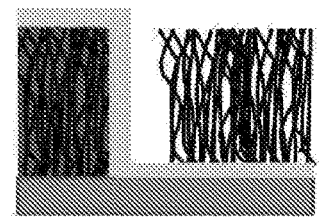
Figure 5F:
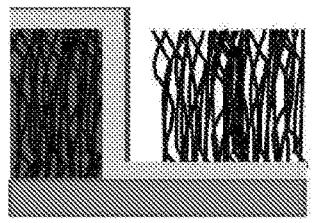
Figure 5G:
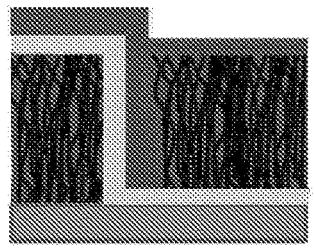
Figure 5H:
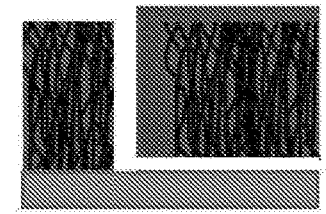

The present technology provides for fabrication of high aspect ratio MEMS and other three-dimensional microstructures from many different materials including (but not limited to) silicon and silicon nitride, silicon dioxide, carbon, and metals. FIGS. 1A-1C illustrate various structures created using the present technology. FIG. 1A is an SEM image of an exemplary 3 µm pitch grid pattern grown to 580 µm in height. FIG. 1B is an SEM image of various silicon nitride structures fabricated using a nitride CNT-M process in accordance with one exemplary embodiment of the invention. FIG. 1C is an SEM image of freestanding carbon infiltrated CNT-M cell gripper device: one of various MEMS structures that can be created using the present invention.

FIG. 2 illustrates an exemplary process for carbon nanotube-templated microfabrication (CNT-M) of MEMS. In this embodiment, a thin catalysis layer (iron on alumina typically) can be deposited on a substrate and patterned (see FIG. 2A). After this, nanotube growth can be initiated by various manners described herein or in preceding applications to the present inventors (see FIG. 2B). At FIG. 2C, the nanotube forest can be filled (from a partial coating on the nanotubes to nearly solid filling of the structure) using techniques such as CVD or an aqueous liquid electroplating process or combinations of these processes. At FIG. 2D, any potential "floor layer" that is a byproduct of some to the infiltration processes (but not all) can be etched, and at FIG. 2e the underlying layer can be etched, resulting in both attached and free-standing structures. This process can be utilized to create a variety of MEMS structures, as would be readily appreciated by one of ordinary skill in the art having possession of this disclosure.

The present inventors have developed a CNT-M process for fabrication of high aspect ratio MEMS and other three-dimensional microstructures from many materials. The nanotubes grown (shown for example in FIG. 2B) can be grown to over 500 microns in height, with lateral pattern dimensions down to 2-3 microns. In this manner, the aspect ratios in the gaps formed can be greater than 200:1. Based on a very low edge roughness (~100 nm), gap spacing can be reduced even further using improved but basic lithography only to 1 µm or below, further increasing aspect ratio.

Despite the solid appearance of the CNT structures prior to infiltration (see, e.g., FIG. 1A), the vertically aligned carbon nanotube material is typically very low density (less than 1% solid by volume) and mechanically very weak. The degree of infiltration of the nanotube template can be variable from a nearly solid structure to very limited, resulting in a porous structure. The nearly solid structures have properties that are very similar to the infiltration material. One key feature of the low degree of infiltration processes is that the individual nanotubes are linked up to the neighboring nanotubes giving a structure that is sufficiently strong to be handled and placed in liquids without destroying the framework.

FIG. 3 illustrates low pressure chemical vapor deposition (LPCVD) infiltration of silicon into patterned CNT forests. This is a typical example of the infiltration processes that can be utilized. At 3A, a schematic of the radial filling process is provided, with some voids remaining in the composite. 3B includes an SEM image showing the outside of an as-grown forest. The dotted box in the inset indicates schematically the location of the image on a wall of nanotubes. Scale bar 500 nm, 50° tilt. At 3C, the outer wall of the forest is shown after filling with silicon. Scale bar 500 nm, 50° tilt. Inset shows the location of the image. At 3D, a cleaved cross-section of a silicon-filled forest is provided. This image was taken at 50° tilt. Scale bar 1 µm. The dotted box in the inset indicates the location of this image.

The infiltration can come from a variety of processes depending upon the desired infiltration material. For silicon and silicon nitride, low pressure chemical vapor deposition (LPCVD) can be used. For carbon, CVD can be done at atmospheric pressure. For metals, CVD processes or electroplating can be used. One challenge in infiltration is tuning the basic deposition processes to coat the nanotubes conformally and uniformly in order to achieve high fill density. The ideal conditions result in growth rates limited by surface kinetics rather than mass transport of reactants to and from the growth sites. When transport of reactants dominates the process, the coating is on the outside of the nanotube form while when surface kinetics dominates the coating is uniform throughout the structure. In between these extremes, the infiltration is dependent on distance from exposed surfaces, and tuning the geometry of the structure can be important.

While in one aspect of the invention the CNT-M process can be carried out using ceramics (silicon, carbon and silicon nitride, etc.), in other aspects a metal or metal alloy can be utilized. For example, in one embodiment, electroplating with nickel was used to infiltrate CNT forest templates. Prior to electroplating, a thin carbon infiltration can be performed to link the nanotubes together and make the CNT forest or frame sufficiently robust for liquid processing. Pulsed current electroplating can be performed to uncouple the depositing of metal during current flow (surface reactions) from the mass transport or diffusion of reactants into the forest. In one example a nickel sulfamate/nickel chloride electroplating bath was used at 40° C. FIGS. 4A and 4B include SEM images of grid patterns formed in this manner with about 2-micron-wide features. One of ordinary skill in the art will appreciate from these figures that very good infiltration uniformity can be achieved at this feature size. Much larger features may require different pulse plating conditions and possibly spaced access holes for increased ion transport. However, such features can be readily incorporated into the present invention.

In one exemplary aspect of the invention, metal CNT-M MEMS structures can be created for use in sensing applications (e.g., transductive capacitors and the like). Generally, capacitive transduction sensitivity increases as the inverse of gap size so very small gaps between resonator and sense electrodes are desirable. This typically requires high vertical sidewall straightness and low sidewall roughness. High aspect ratio pores (over 200:1) have been fabricated by the present inventors using CNT-M due to the excellent straightness and low surface roughness of the pore walls. The present technology achieves trench aspect ratios of least 100:1 using the CNT-M process illustrated in FIG. 2. Trench structures may have different achievable aspect ratios than pore structures, as CNT forest features are not locally connected across the trench. Thus, trench structures may require a higher inherent growth verticality.

Much higher aspect ratios can be achieved by extending the CNT-M process to define the vertical capacitive sensing gap between the resonator and the detection electrodes by adding a sacrificial layer on an electropolished sense electrode and then using the sacrificial layer to "template" the capacitive gap. This process can proceed as shown in FIG. 5. Both organic and inorganic sacrificial layers can be utilized to produce layers that have both high uniformity and highly selective etch rates relative to nickel.

The phases depicted in FIG. 5A through 5H illustrate one exemplary manner in which very small gaps can be formed between components of a device. The process can proceed as follows: at 5A, VACNT forests can be grown on a catalyst pattern defining resonator and sense electrode. At 5B, brief deposition of carbon on the VACNT can be used to tie CNTs together, making the frame sufficiently robust for wet processing. An oxygen plasma etch step can be used to remove the floor layer, electrically isolating the resonator and sensing electrodes. At 5C, the sensing electrodes can be electrically connected to the plating power supply and plated.

At 5D, electropolishing can be used to smooth the "sense" electrode surface. At 5E, a sacrificial layer can be electrodeposited or grown on the sense electrode surface. At 5F, the surface of the sacrificial layer can be seeded and electroless plated (if needed) to make the surface conductive. At 5G, nickel plating can form the resonator. Solid surface of the sacrificial layer can provide a flat non-porous surface to template smooth outer nickel surface on the resonator. At 5H, mechanical polishing can be used to expose the top edge of the sacrificial layer and the sacrificial layer can be selectively etched until removed.

Various other microscale- or MEMS-sensing devices can be provided in accordance with other aspects of the invention. For example, sensing in extreme environments can be enabling for a wide variety of applications, including several in the energy industry. One area of sensing for energy applications is acceleration sensing in high temperature, high acceleration, and corrosive environments. These include the environments in turbines used in both aircraft and ground based power generation systems. Exploration for oil and drilling for carbon sequestration can also benefit from vibration sensing in the high temperature and high acceleration environment of a drilling head. The present technology can be utilized to provide a class of remotely detectable wireless passive microscale or MEMS acceleration sensors based on structures that are stable in high temperature (at least 1000° C. and potentially over 1400° C.) environments.

Figure 6:
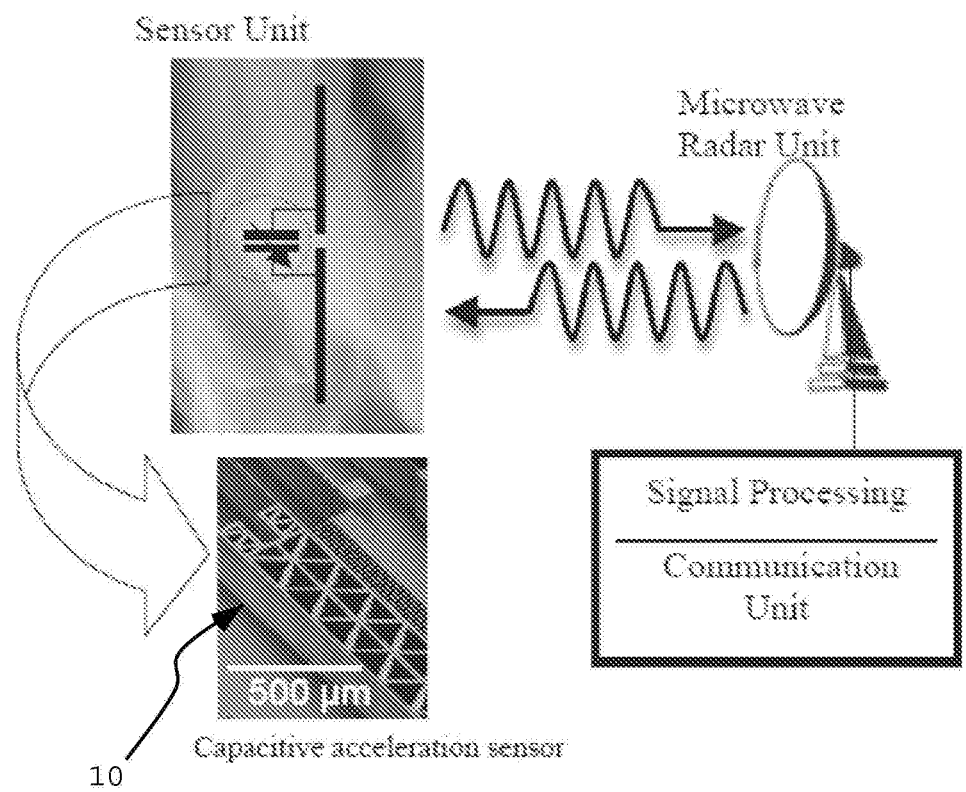
FIG. 6 is a schematic illustration of an exemplary remote sensing unit utilizing microscale devices in accordance with the present invention for use in extreme sensing conditions.

As an example, as illustrated in FIG. 6, in one embodiment of the invention a remote sensing unit can be provided that can contain an antenna attached to an MEMS capacitive acceleration sensor. Vibrations can produce shifts in the sensor unit's microwave resonance, and the reader unit can detect the resonance changes by exciting the sensing unit with microwave radiation and detecting the reflected radiation (essentially, using radar).

While the discussions herein focus primarily on vibration sensing, low frequency and constant acceleration can also be detectable by this device. The sensor technology can also be adaptable to a wide variety of sensing challenges including measurements of sound pressure gradients, temperature, and chemical sensing. The present technology can address the following sensor fabrication challenges not heretofore accomplished: the sensors can be fabricated from materials that are stable in the high temperature environments they will be probing. The sensor structures can be fabricated from metals with high conductivity to achieve high sensitivity. High aspect ratio structure can be provided for high out-of-plane mechanical stiffness and high capacitance sensitivity, resulting in a sensor with less cross-talk and higher resolution.

These fabrication challenges can be met using a rapid, facile carbon nanotube template microfabrication (CNT-M) process that allows for microfabrication of high aspect ratio structures from a variety of refractory metals, including, without limitation, tungsten, nickel, and platinum.

In one embodiment of the invention, the sensor can operate on the principle of scattering of far-field radiation emitted by a reader antenna. The emitted radiation can be reflected by the sensor antenna, and can be sensed by either the reader antenna itself or by a third antenna located near the emitting antenna. The sensor antenna's reactance can be modified by the sensed signal. In this case, acceleration of the movable mass can change the capacitance attached to the sensor antenna. This modified reactance changes the resonant frequency and quality factor for the radiation reflected by the sensor antenna, resulting in a change of the radar cross section of the sensor. The reader antenna can either perform a frequency sweep to find the sensor antenna's resonant frequency, or it can read changes in the radar cross section at a discrete number of frequencies.

One advantage of this wireless sensing technique, compared for instance to inductive coupling, is increased range. For this reason, a very similar technique is used for many passive RFID tags, resulting in a typical read range of several (3-20) meters (depending on the gain of the reader antenna). However, unlike RFID tags, the sensor requires no digital electronics or wiring at the sensing location, since the electronics would be unlikely to survive for long periods at high temperature. The sensor also operates without a battery, which is important both for high temperatures and for long-term operation. The downside, as with RFID tags, is that relatively high read power (about 1 W) is required for reading the sensor. Assuming that the sensor uses a dipole antenna, a relatively simple model can be used to predict the resonant frequency changes in response to acceleration.

Returning to FIG. 1C, one of a myriad of MEMS structures that can be formed using the present technology is illustrated. In this instance, a MEMS device 10 is provided that can serve as a gripping device. The gripping device can include base members 12 that will be anchored stationary relative to various moving components. Grip arms 14 move relative to the base members in response to actuation applied to lever arm 16. While the mechanics of this simple example are relatively straightforward, the process for providing MEMS devices on the present scale and formed of the present materials have proved prohibitively difficult in past endeavors.

While the forgoing examples are illustrative of the principles of the present invention in one or more particular applications, it will be apparent to those of ordinary skill in the art that numerous modifications in form, usage and details of implementation can be made without the exercise of inventive faculty, and without departing from the principles and concepts of the invention. Accordingly, it is not intended that the invention be limited, except as by the claims set forth below.

What is claimed is:

1. A device, comprising:
a patterned forest of vertically grown and aligned carbon nanotubes defining a carbon nanotube forest with the carbon nanotubes having a height defining a thickness of the patterned forest, the patterned forest defining a patterned frame that defines one or more components of the microscale device;
a conformal non-metal coating of substantially uniform thickness extending throughout the carbon nanotube forest, the carbon nanotube forest having a thickness of at least three microns, the conformal non-metal coating substantially coating the carbon nanotubes, defining coated nanotubes and connecting adjacent nanotubes together such that the carbon nanotube forest is sufficiently robust for a wet etching process, without substantially filling interstices between individual coated nanotubes, wherein the connecting adjacent nanotubes together increases a strength of the carbon nanotube forest above a threshold level to withstand forces applied during the wet etching process; and a metallic interstitial material infiltrating the carbon nanotube forest and at least partially filling interstices between individual non-metal coated nanotubes.

2. The device of claim 1, wherein at least one component of the patterned frame is fixed and at least one component of the patterned frame is moveable relative to a fixed component.

3. The device of claim 1, wherein the metallic interstitial material is applied by an electroplating process, wherein the metallic interstitial material infiltrates the carbon nanotube forest with an infiltration uniformity achieved by application of the electroplating process to the carbon nanotube forest.

4. The device of claim 1, wherein the thickness of the carbon nanotube forest is between 3 μm (microns) and 9 mm.

5. The device of claim 2, wherein the microscale device comprises a microelectromechanical systems (MEMS) device.

6. The device of claim 1, wherein the microscale device defines at least a portion of a sensor.

7. The device of claim 6, wherein the sensor comprises a gyro.

8. The device of claim 7, wherein the gyro comprises a transductive capacitor comprising a capacitive gap in the form of a trench defined by the microscale device, the trench comprising a height-to-width ratio of at least 100:1.

9. The device of claim 1, wherein the metallic interstitial material comprises nickel.

10. The device of claim 1, wherein the conformal non-metal coating is silicon or silicon nitride.

11. A microscale device, comprising:
a patterned forest of vertically grown and aligned carbon nanotubes defining a carbon nanotube forest with the carbon nanotubes having a height defining a thickness of the forest, the patterned forest defining a patterned frame that defines one or more components of the microscale device, the carbon nanotube forest comprising at least one feature comprising a height-to-width ratio greater than 100:1, wherein:
the carbon nanotubes are vertically grown via chemical vapor deposition (CVD); and
the carbon nanotubes form a wall bordering the feature, the wall having a surface roughness of approximately 100 nm;
a conformal coating of substantially uniform thickness extending throughout the carbon nanotube forest, the carbon nanotube forest having a thickness of at least three microns, the conformal coating substantially coating the carbon nanotubes that are vertically grown via the CVD, defining coated nanotubes and connecting adjacent nanotubes together, without substantially filling interstices between individual coated nanotubes; and
a metallic interstitial material infiltrating the carbon nanotube forest and at least partially filling interstices between individual coated nanotubes.

12. The microscale device of claim 11, wherein the feature comprises a height-to width ratio greater than 200:1.

13. The microscale device of claim 11, wherein at least one component of the patterned frame is fixed and at least one component of the patterned frame is moveable relative to a fixed component, wherein the microscale device defines at least a portion of a gyro comprising a transductive capacitor, wherein the feature comprises a capacitive gap in the form of a trench defined by the microscale device.

14. The microscale device of claim 11, wherein the metallic interstitial material is applied by an electroplating process, wherein the metallic interstitial material infiltrates the carbon nanotube forest with an infiltration uniformity achieved by application of the electroplating process to the carbon nanotube forest.

15. A microscale device, comprising:
a patterned forest of vertically grown and aligned carbon nanotubes defining a carbon nanotube forest with the carbon nanotubes having a height defining a thickness of the patterned forest, the patterned forest defining a patterned frame that defines one or more components of the microscale device, wherein the carbon nanotubes are vertically grown via chemical vapor deposition (CVD);
a conformal non-metal coating of substantially uniform thickness extending throughout the carbon nanotube forest, the carbon nanotube forest having a thickness of at least three microns, the non-metal conformal coating substantially coating the carbon nanotubes that are vertically grown via the CVD, defining coated nanotubes and connecting adjacent nanotubes together, without substantially filling interstices between individual coated nanotubes; and
a metallic interstitial material infiltrating the carbon nanotube forest and at least partially filling interstices between individual coated nanotubes, wherein the metallic interstitial material infiltrates the carbon nanotube forest with an infiltration uniformity achieved by application of an electroplating process to the carbon nanotube forest.

16. The microscale device of claim 15, wherein the infiltration uniformity is achieved by application of a pulsed current.

17. The microscale device of claim 15, wherein the carbon nanotube forest comprises at least one feature comprising a height-to-width ratio greater than 100:1.

18. The microscale device of claim 17, wherein at least one component of the patterned frame is fixed and at least one component of the patterned frame is moveable relative to a fixed component, wherein the microscale device defines at least a portion of a gyro comprising a transductive capacitor, wherein the feature comprises a capacitive gap in the form of a trench defined by the microscale device.

19. The microscale device of claim 15, wherein the conformal non-metal coating is a ceramic material.

* * * * *